United States Patent [19]
Ikata et al.

[11] Patent Number: 5,786,738
[45] Date of Patent: Jul. 28, 1998

[54] SURFACE ACOUSTIC WAVE FILTER DUPLEXER COMPRISING A MULTI-LAYER PACKAGE AND PHASE MATCHING PATTERNS

[75] Inventors: Osamu Ikata; Nobuo Hirasawa; Kazushi Hashimoto; Masanori Ueda; Yoshio Satoh, all of Kawasaki, Japan

[73] Assignee: Fujitsu Limited, Kanagawa, Japan

[21] Appl. No.: 652,642

[22] Filed: May 31, 1996

Related U.S. Application Data

[63] Continuation-in-part of Ser. No. 603,615, Feb. 21, 1996, abandoned.

[30] Foreign Application Priority Data

May 31, 1995 [JP] Japan ................... 7-134311

[51] Int. Cl.⁶ .................................................. H03H 9/72
[52] U.S. Cl. ................................... 333/133; 333/193
[58] Field of Search ......................... 333/126, 132–134, 333/193

[56] References Cited

U.S. PATENT DOCUMENTS

| 4,737,742 | 4/1988 | Takoshima et al. ........... 333/193 X |
| 5,554,960 | 9/1996 | Ohnuki et al. ............... 333/132 |
| 5,561,406 | 10/1996 | Ikata et al. ................. 333/133 X |

FOREIGN PATENT DOCUMENTS

| 62-0269402 | 11/1987 | Japan ........................ 333/33 |
| 405095253 A | 4/1993 | Japan ........................ 333/193 |
| 405235688 A | 9/1993 | Japan ........................ 333/193 |
| 406097761 A | 4/1994 | Japan ........................ 333/134 |

Primary Examiner—Robert J. Pascal
Assistant Examiner—Barbara Summons
Attorney, Agent, or Firm—Armstrong, Westerman, Hattori, McLeland & Naughton

[57] ABSTRACT

In a duplexer, phase matching circuit patterns corresponding to filter chips are formed on a surface layer of a multi-layer ceramic package provided with filter chips having different central frequencies. An end of each of the phase matching circuit patterns is connected to a common terminal pattern.

11 Claims, 14 Drawing Sheets

SURFACE ACOUSTIC WAVE FILTER DUPLEXER COMPRISING A MULTI-LAYER PACKAGE AND PHASE MATCHING PATTERNS

This application is a Continuation-in-Part of application Ser. No. 08/603,615, filed Feb. 21, 1996, now abandoned.

BACKGROUND OF THE INVENTION

1. Field of the invention

The present invention relates to duplexers and, more particularly, to a duplexer in which a surface acoustic wave (SAW) band pass filter (hereinafter, referred to as a SAW band pass filter) is used.

Recently, the size of portable communication equipment, an example of which is a portable telephone, has been rapidly reduced. Associated with this, reduction of the size and improvement in the performance of components used in portable communication equipment are desired. A duplexer is known as a component to split or generate a signal in radio communication equipment such as a portable telephone. Many duplexers are constructed of a band pass filter using a dielectric, a band rejection filter or a combination of both filters. Duplexers using a SAW band pass filter are currently being studied and developed.

2. Description of the prior art

Conventionally, in order to prevent filter characteristics of two SAW band pass filter chips (having pass-band central frequencies $f_1$ and $f_2$, respectively) constituting a duplexer from interfering with each other, it is necessary to provide a phase matching circuit in each of the two SAW band pass filter chips. The constant of the matching circuit is determined by the central frequencies of the two filter chips and a difference therebetween. By accommodating the filter chips in a ceramic package, a compact duplexer is provided.

FIGS. 1A, 1B and 1C show a construction of a conventional duplexer 11. FIG. 1A is a perspective view, FIG. 1B a top sectional view, and FIG. 1C a longitudinal sectional view.

The duplexer 11 shown in FIGS. 1A–1C is a multi-layer ceramic package 18 comprising a plurality of green sheets 12. A ground layer GND is formed in each of the green sheets 12. A phase matching line 13a is provided between the predetermined green sheets 12, and another matching line 13b is provided between the predetermined green sheets 12. Filter chips 14a and 14b are mounted in a space created by the top three layers. Around the filter chips 14a and 14b are formed grounding terminals 15, filter signal terminals 16, and common signal terminals 17. A reception terminal 19, a transmission terminal 20 and an antenna terminal 21 are formed to extend from the bottom to the side of the multi-layer ceramic package 18.

Wires 22 establish electric connection between the filter chips 14a and 14b near the top of the multi-layer ceramic package 18 and the respective grounding terminals 15, the filter signal terminals 16 and the common signal terminals 17. A metal cap 23 hermetically seals a top opening.

The filter chips 14a and 14b have different center frequencies. The phase matching lines 13a and 13b are formed of strip lines at the same time as the multi-layer ceramic package 18. By providing the phase matching lines 13a and 13b within the multi-ceramic package 18, the dielectric constant of the package can be taken advantage of. By reducing the length of the lines, the reduction of the size of the package is achieved.

In the duplexer 11 constructed as above, the characteristics of the filter chips 14a and 14b are affected by the circuit patterns of the phase matching lines 13a and 13b. For example, the impedance of the filter chips 14a and 14b is substantially identical to the line impedance $Z_0$ of an external circuit in a pass band (in this case, $Z_0 \approx 50$ Ω). In the attenuation band, the impedance of the filter chips 14a and 14b is far higher in level than those of an external circuit. Degradation in these aspects of the characteristics of the filter chips 14a and 14b should be avoided. For this purpose, it is ideal, in a pass band for one of the filter chips 14a and 14b, that the impedance of the other of the filter chips 14a and 14b be infinity and the reflection coefficient be substantially 1.

A phase matching circuit is necessary in order to provide the above-described characteristic. In actuality, a phase matching circuit is embodied by a strip line. When a phase matching circuit is embodied by a strip line pattern, the resistance of the phase matching circuit becomes proportional to the length of the line. A great resistance results in an increase in the floating capacity which affects the distributed constant and in a signal transmission loss. The higher the frequency and the higher the dielectric constant of the package, the more the phase matching circuit constant is affected by the floating capacity. One approach to resolve this problem is to construct a line pattern by forming a low-resistance conductor in a material having a small dielectric constant. For example, a copper conductor pattern is formed in a glass-ceramic material.

Forming a copper conductor pattern in a glass-ceramic material characterized by a small dielectric constant provides a duplexer having an improved quality. However, a glass-ceramic material is known to have a relatively low rigidity and provides a unfavorable contact with a conductor. Therefore, a glass-ceramic material lacks reliability in actual use.

Using an alumina-ceramic material instead of a glass-ceramic material and using tungsten instead of copper invite a loss due to the resistance of the conductor and also invite degradation in characteristics due to a floating capacity.

SUMMARY OF THE INVENTION

Accordingly, an object of the present invention is to provide a duplexer in which the aforementioned problems are eliminated.

Another and more specific object of the present invention is to provide a duplexer in which the conductor material is improved. It is also intended that the package according to the present invention enables a combination of several frequency characteristic patterns, and the duplexer provides an improved flexibility in terms of the orientation of the external connection terminals.

In order to achieve the aforementioned objects, the present invention provides a duplexer embodied by a multi-layer package, the multi-layer package comprising: a predetermined number of surface-acoustic-wave band pass filter chips having different pass-band central frequencies; and phase matching circuit patterns provided between the surface-acoustic-wave band pass filter chips; wherein the phase matching circuit patterns are formed on a surface layer of the multi-layer package. The phase matching circuit patterns may be formed as microstrip lines or as layers containing a copper member. According to the duplexer of the present invention, it is possible to form a phase matching circuit pattern of a low-resistance conductor so that degradation in the reflection coefficient due to the floating capacity is remedied so that degradation in the filter characteristic is suppressed or reduced.

In one preferred embodiment of the present invention, a grounding layer is provided above the phase matching circuit patterns via a gap. According to this aspect of the invention, an external influence such as the characteristic impedance can be reduced so that the stability of the multiplexing characteristic is ensured.

In another preferred embodiment of the present invention, a predetermined number of external connection terminals are formed in a bottom layer of the multi-layer package, and each of the phase matching circuit patterns is connected to one of the external connection terminals via a common terminal. The phase matching circuit patterns may include a predetermined number of adjustment patterns for adjustment of the length of the phase matching circuit patterns. According to this aspect of the invention, external connection terminals formed in the package may be oriented with an improved flexibility, and adjustment of the length of the lines becomes facilitated. Thus, a common package may be used for different types of duplexers and the duplexer provides an improved flexibility in terms of the orientation of the external connection terminals.

The aforementioned objects can also be achieved by a method of fabricating a duplexer embodied by a multi-layer package provided with a predetermined number of surface-acoustic-wave band pass filter chips having different pass-band central frequencies, and with phase matching circuit patterns provided between the surface-acoustic-wave band pass filter chips, the method comprising the steps of: forming a predetermined number of green sheets; forming predetermined patterns on the green sheet and forming openings as required; building the predetermined number of green sheets into a multi-layer green-sheet structure and subjecting the multi-layer green-sheet structure to a sintering process; forming a pattern film on top of the multi-layer green-sheet structure; etching the pattern film so as to form the predetermined number of matching circuit patterns; separating the multi-layer green-sheet structure into individual multi-layer packages; forming external connection terminals in the multi-layer package; mounting the surface-acoustic-wave band pass filter chips in the multi-layer package; establishing required electrical connections in the multi-layer package; and hermetically sealing the multi-layer package with a cap. According to this aspect of the invention, the phase matching circuit pattern is formed in a process separate from that of the green sheet. Thus, selection of a material for the conductor is not dependent on the sintering temperature of the green sheet.

The aforementioned objects can also be achieved by a duplexer comprising: a predetermined number of surface-acoustic-wave band pass filter chips having different pass-band central frequencies; and a multi-layer package having the predetermined number of filter chips mounted on a chip mounting surface and having terminals for connection with external circuits formed in a bottom layer of the multi-layer package, a phase matching circuit pattern is connected between the surface-acoustic-wave band pass filter chips, wherein the phase matching circuit pattern being formed between the chip mounting surface and the terminals. The phase matching patterns may be formed as microstrip lines or as layers containing a copper member. According to the duplexer described above, degradation in the reflection coefficient due to the floating capacity can be remedied so that degradation in the filter characteristic can be prevented. Since the phase matching circuit pattern is made to face the board on which the duplexer is mounted, radiation to the outside is restricted.

In one preferred embodiment, common grounding patterns may be formed between the chip mounting surface and the terminals. According to this aspect of the present invention, wirings (castellations) formed on the outside of the package to connect the common grounding pattern and the terminals can be shorter. As a result, it is possible to reduce an inductance of the castellations and improve the attenuation characteristic outside the pass band.

In another preferred embodiment, an antenna terminal pattern connected to the filter chips may be formed inside the multi-layer package. According to this aspect of the present invention, leakage of signals from the antenna terminal pattern can be reduced.

BRIEF DESCRIPTION OF THE DRAWINGS

Other objects and further features of the present invention will be apparent from the following detailed description when read in conjunction with the accompanying drawings, in which.

DESCRIPTION OF THE PREFERRED EMBODIMENTS

Figure 2A:
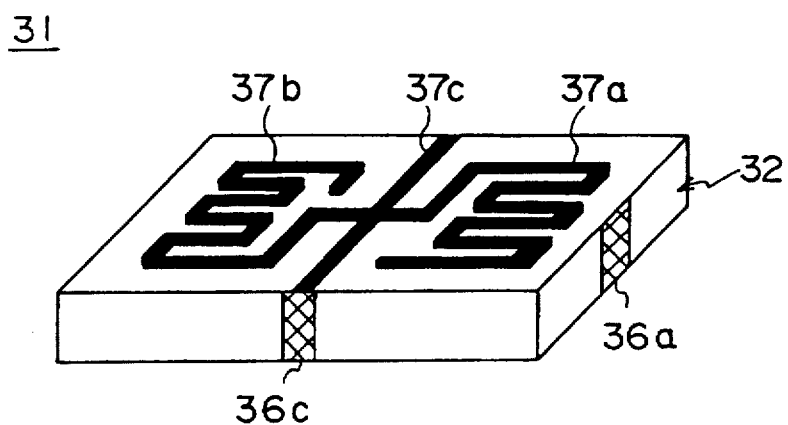
FIGS. 2A is a perspective view of a duplexer according to a first embodiment of the present invention.
Figure 2B:
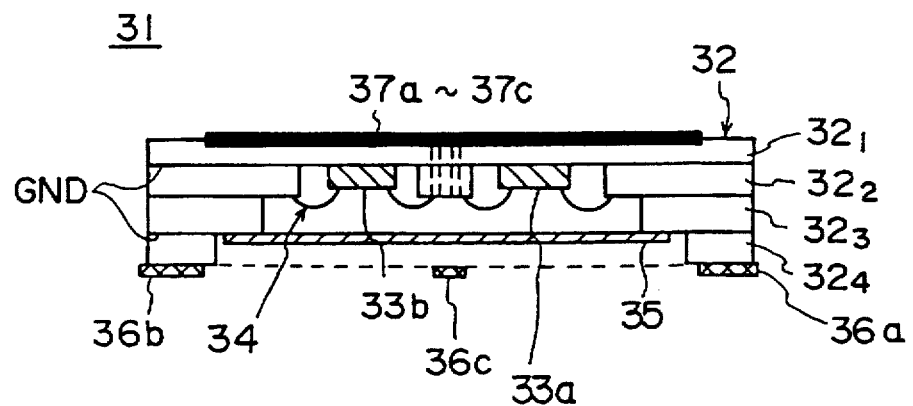
FIG. 2B is a longitudinal sectional view of the duplexer according to the first embodiment of the present invention.

FIGS. 2A and 2B show a construction of a duplexer according to a first embodiment of the present invention.

Specifically, FIG. 2A is a perspective view, and FIG. 2B is a longitudinal sectional view. In a duplexer 31 shown in FIGS. 2A and 2B, a multi-layer ceramic package 32 is formed of four layers $32_1$–$32_4$, for example. Ground (GND) patterns are formed on the underside of the layers $32_1$ and $32_3$. Signal patterns (including a pattern for the power supply) are formed on the underside of the layer $32_2$. The layers $32_1$–$32_4$ are provided with respective openings so as to create a cavity for accommodating SAW band pass filter chips 33a and 33b. The frequency characteristics of the filter chips 33a and 33b will be described with reference to FIG. 4.

The filter chips 33a and 33b are mounted on the underside of the layer $32_1$ and connected to respective signal patterns on the layer $32_2$ via wires 34. A cap 35 is provided to cover the opening of the layer $32_3$ so as to hermetically seal the cavity.

Through holes link the layers $32_1$–$32_4$. External connection terminals 36a–36c are provided to extend from respective lateral sides of the package 32 to the underside of the layer $32_4$. For example, the external 36a shown in FIGS. 2A and 2B is a reception terminal connected to the filter chip 33a; the external connection terminal 36b is a transmission terminal connected to the filter chip 33b; and the external connection terminal 36c is an antenna terminal connected to a common terminal described later.

As shown in FIG. 2A, two meandering phase matching circuit patterns 37a and 37b formed of, for example, a copper material and corresponding to the filter chips 33a and 33b, respectively, are provided on the topmost layer $32_1$. One end of each of the patterns 37a and 37b is connected to a common terminal pattern 37c, and the other end of each of the patterns 37a and 37b is connected to the filter chips 33a and 33b, respectively, via the through holes. The common terminal pattern 37c is connected to the antenna terminal 36c formed on the multi-layer package 32.

Figure 3:
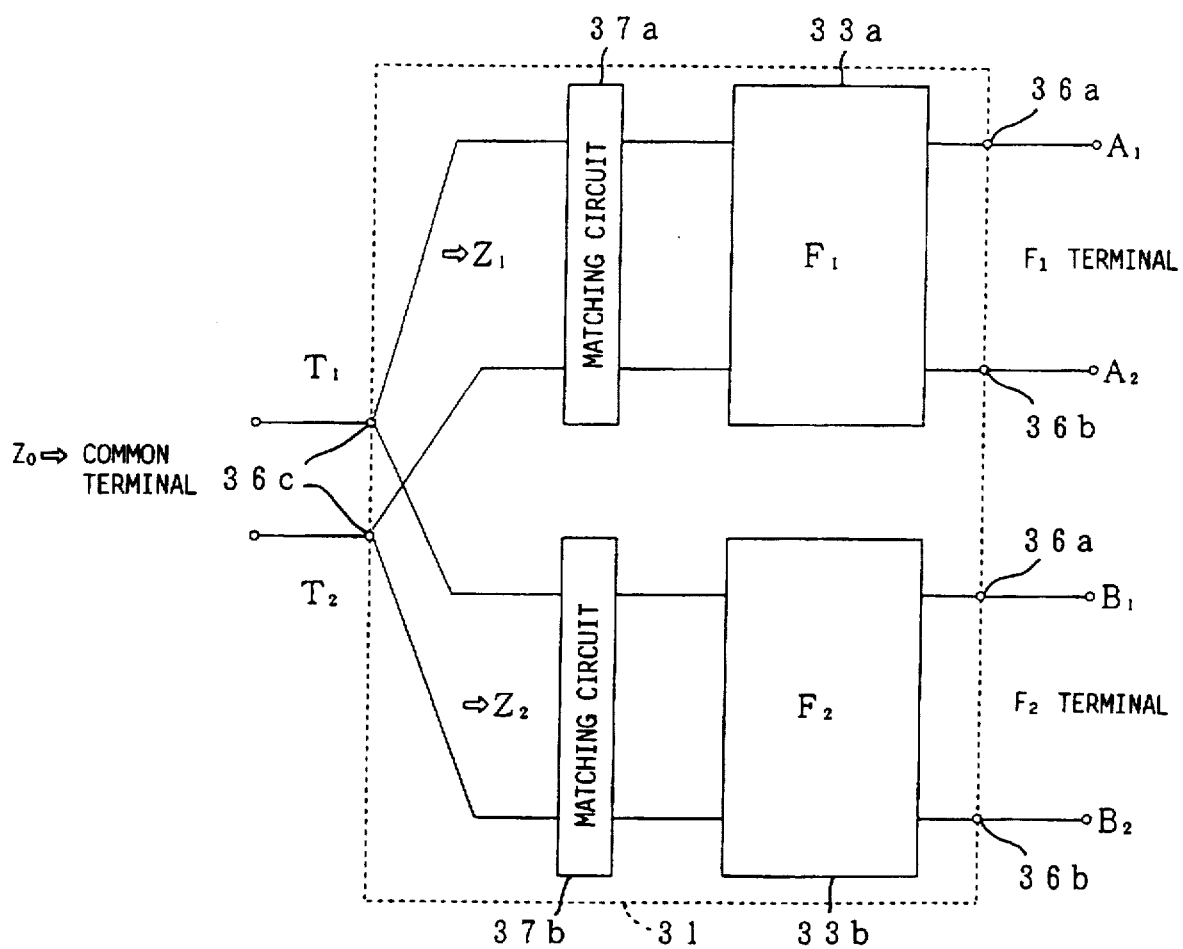
FIG. 3 shows an example of a circuit of the duplexer shown in FIGS. 2A and 2B.
Figure 4:
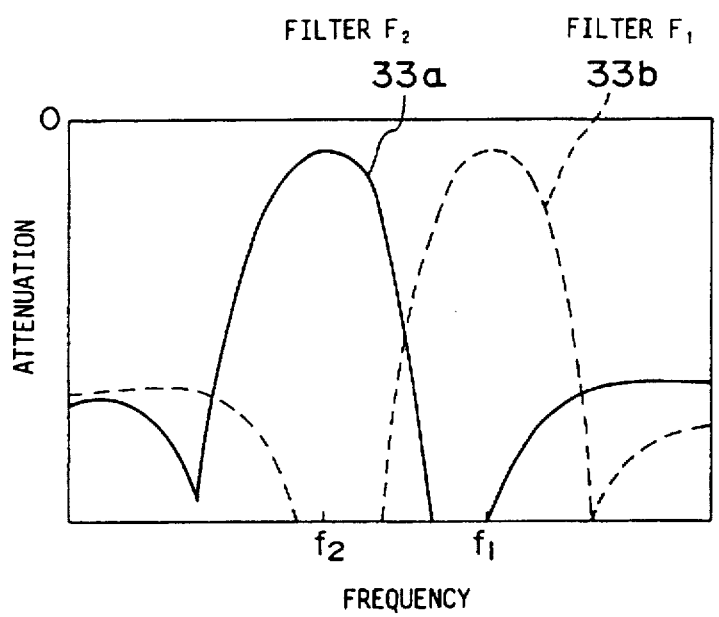
FIG. 4 shows a characteristic of the duplexer shown in FIGS. 2A and 2B.

FIGS. 3 shows an example of circuit of the duplexer shown in FIGS. 2A and 2B. FIG. 4 shows a characteristic of the duplexer shown in FIGS. 2A and 2B. As shown in FIG. 3, two filter chips $F_1$ and $F_2$ (33a, 33b) are connected to common terminals $T_1$ and $T_2$ (the common terminal pattern 37c) connected to the antenna terminal 36c via the phase matching circuits 37a and 37b. The reception terminal 36a is connected to a terminal $A_1$ or a terminal $B_1$; and the transmission terminal 36b is connected to a terminal $A_2$ or a terminal $B_2$, the terminals $A_1$ and $A_2$ being provided in the filter chip $F_1$, and the terminals $B_1$ and $B_2$ being provided in the filter chip $F_2$.

As shown in FIG. 4, the filter chips $F_1$ and $F_2$ (33a, 33b) have different central frequencies. For example, the filter chip $F_1$ (33a) has a central frequency ($f_1$) of 836 MHz, and the filter chip $F_2$ (33b) has a central frequency of 881 MHz.

Figure 5:
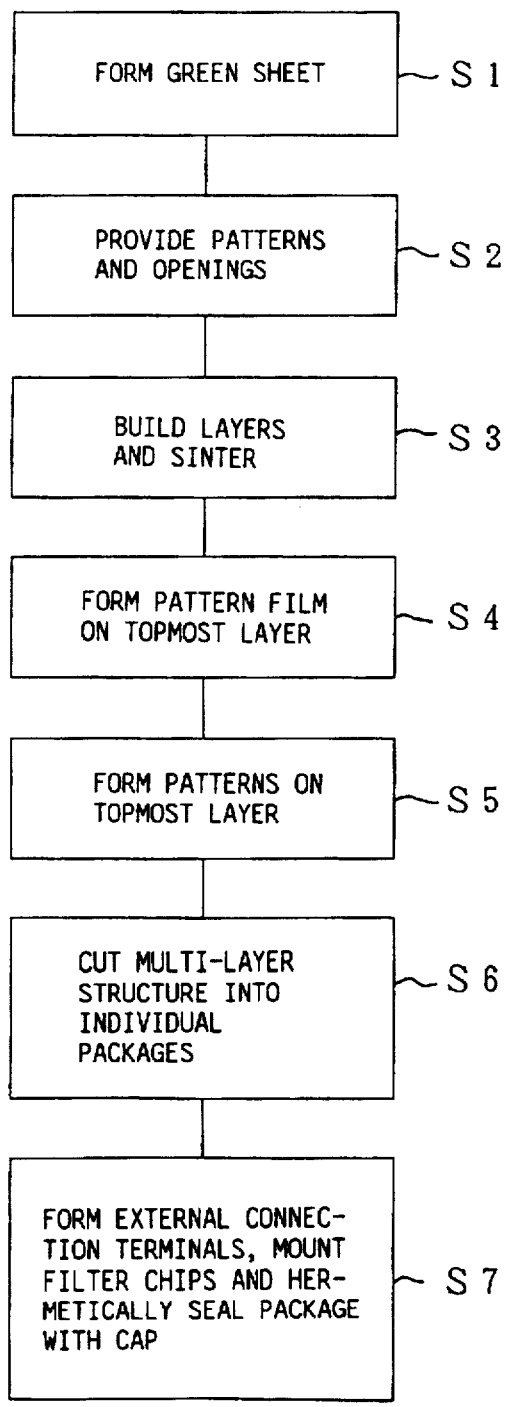
FIG. 5 shows a process of fabricating the duplexer according to the present invention.

FIG. 5 shows a process of fabricating the duplexer according to the present invention. Referring to FIG. 5, a necessary number of green sheets embodying the layers $32_1$–$32_4$ shown in FIGS. 2A and 2B are formed (step S1). A green sheet is a ceramic sheet which is not subjected to sintering and formed of an alumina having a dielectric constant of 9.7. A signal pattern and a grounding pattern are formed on the respective layer embodied by the green sheet. openings which form a cavity for accommodating the filter chips 33a and 33b are also formed (S2).

Subsequently, the green sheets are built one upon another, and the resultant multi-layered structure is subjected to sintering at 1500°–1600° C. for about 5–24 hours (S3). In this state, a plurality of multi-layer ceramic packages are not separated from each other. A pattern film formed of a copper, for example, is provided by evaporation deposition on the topmost layer (S4). The pattern film is then etched so that a desired number of meandering phase matching circuit patterns 37a and 37b, and common terminal patterns 37c as shown in FIGS. 2A are formed (S5). Thereafter, the multi-layer structure is cut into individual multi-layer ceramic packages 32 (S6).

The external connection terminals 36a–36c are formed to extend from the bottom of the multi-layer ceramic package 32 to the respective sides thereof. The filter chips 33a and 33b are mounted on the multi-layer ceramic package 32 and electrically connected to the respective signal patterns via the wires 34. The package 32 is then hermetically sealed by the cap 35 (S7).

As described above, the process for forming the multi-layer ceramic package 32 and the process for forming the phase matching circuit patterns 37a and 37b are separate from each other. An advantage deriving from this construction is that a low-resistance material (for example, a copper material or a composite material comprising copper, nickel and aluminum) may be used in forming the patterns 37a and 37b, making it possible to reduce the loss due to the matching circuit. Consequently, the length of the matching circuit patterns can be reduced so that the package can be compact and the filter characteristic can be improved.

Figure 6A:
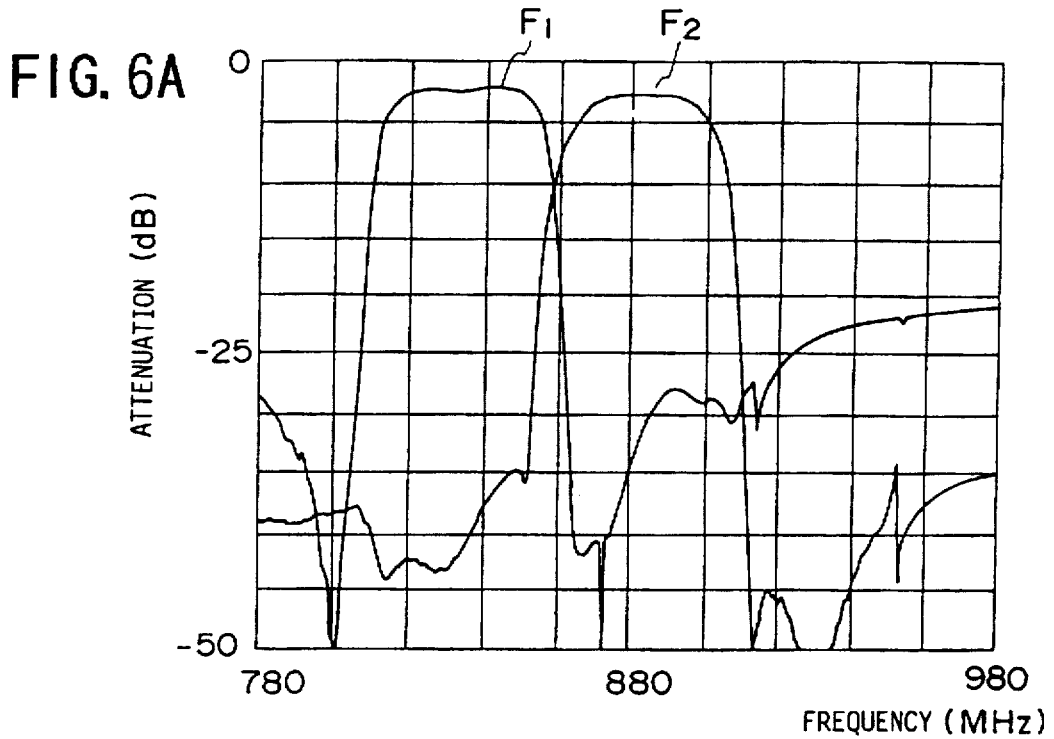
FIGS. 6A and 6B are graphs showing frequency characteristics of the duplexer according to the present invention.
Figure 6B:
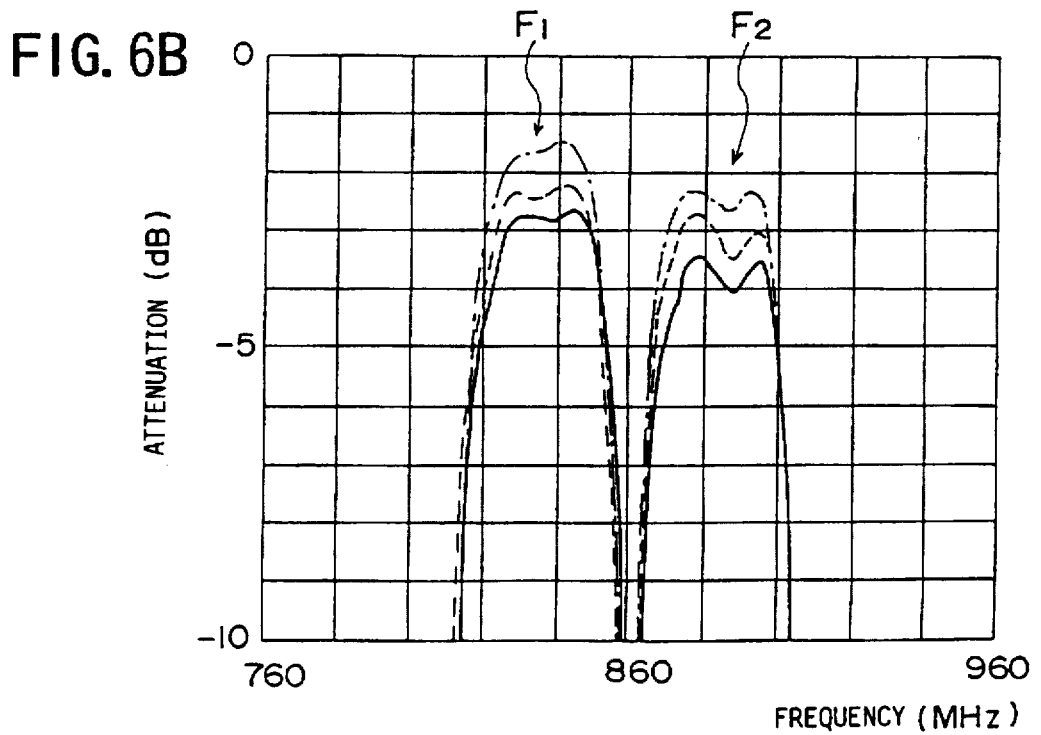

FIGS. 6A and 6B are graphs showing a frequency characteristic of the duplexer according to the present invention. FIG. 6A is a graph showing the general frequency characteristic. FIG. 6B is a graph on an enlarged scale showing a variation in the loss that depends on the construction of the conductor pattern. The frequency characteristic shown in FIGS. 6A and 6B is obtained experimentally by forming the phase matching circuit pattern 37a to have a width of about 200 µm and a length of about 40 mm and by forming the phase matching circuit pattern 37b to have a width of about 200 µm and a length of about 35 µmm. The dielectric constant of the layer $32_1$ of the multiple-layer ceramic package 32 constituting the duplexer 31 is 9.7.

As shown in FIG. 6A, in the filter chip $F_1$ (33a), an attenuation of 2.19 dB occurs at 824 MHz, an attenuation of 2.70 dB at 849 MHz, an attenuation of 41.80 dB at 869 MHz and an attenuation of 28.30 dB at 894 MHz. An attenuation of 3.78 dB occurs at 869 MHz, an attenuation of 3.12 dB at 894 MHz, an attenuation of 42.84 dB at 824 MHz, and an attenuation of 34.94 dB at 894 MHz, in the filter chip $F_2$ (33b).

Figure 1A:
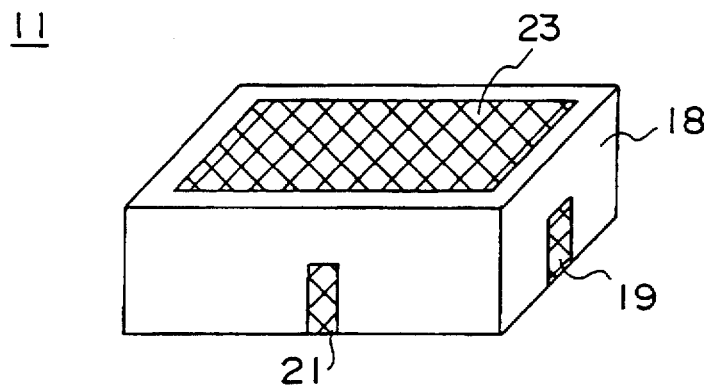
FIG. 1A is a perspective view of a conventional duplexer.
Figure 1B:
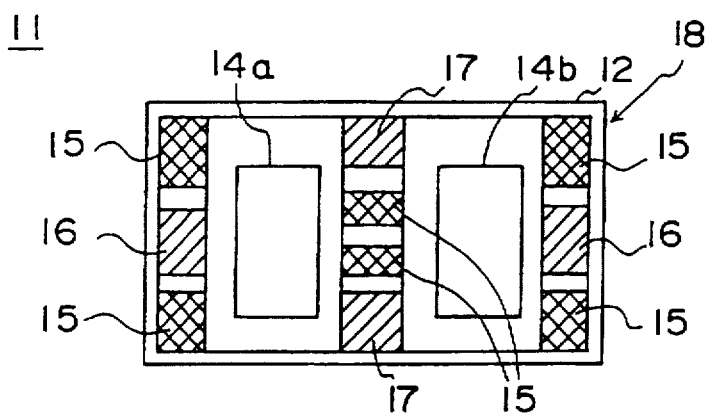
FIG. 1B is a top sectional view of the conventional duplexer.
Figure 1C:
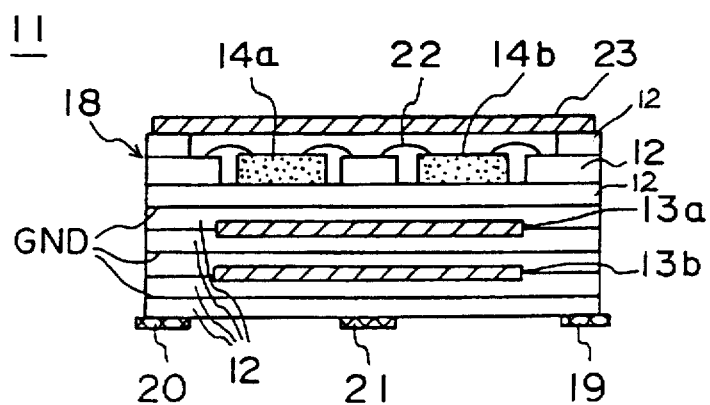
FIG. 1C is a longitudinal sectional view of the conventional duplexer.

In FIG. 6B, a solid line indicates a frequency characteristic of a conventional duplexer constructed as shown in FIGS. 1A–1C, wherein the phase matching circuit is provided within the package by forming a tungsten conductor pattern in an alumina-ceramic material; a broken line indicates a frequency characteristic of the duplexer as shown in FIGS. 2A and 2B, wherein the phase matching circuit patterns 37a and 37b are provided on the topmost layer by forming a tungsten conductor pattern in an alumina-ceramic material; and an alternate long and short dash line indicates a frequency characteristic of the duplexer as shown in FIGS. 2A and 2B, wherein the phase matching circuit patterns 37a and 37b are provided on the topmost layer by forming a copper conductor pattern in an alumina-ceramic material.

It will be noted by referring to FIG. 6B that, on the condition that the phase matching pattern is constructed by forming the tungsten conductor pattern in the alumina-ceramic material, the frequency characteristic of the construction wherein the phase matching circuit pattern is provided near the top of the package (broken line) provides a smaller attenuation in the central frequency and a better filter characteristic than the construction where the phase matching circuit is built within the package (solid line). It will be appreciated that, the construction whereby the copper conductor pattern is used instead of the tungsten conductor pattern (alternated long and short dash line) provides a smaller attenuation and a favorable filter characteristic due to a reduction in the high-frequency loss derived from a reduction in the dc resistance.

To summarize the above, by providing a phase matching circuit pattern formed of a low-resistance material such as a copper near the top of the multi-layer ceramic package 32(for example, as shown in FIGS. 2A and 2B), degradation in the filter characteristic due to the resistance of the pattern is reduced to half that of the conventional package. It will be further appreciated that degradation in the reflection coefficient due to the floating capacity can be remedied so that degradation in the filter characteristic of the duplexer 31 can be prevented. Since the common terminal pattern 37c may be connected to the antenna terminal 36c at either side of the multi-layer ceramic package 32, a board on which the duplexer is mounted can be designed with an increased flexibility in terms of the orientation of the terminals (transmission terminals and reception terminals).

Figure 7:
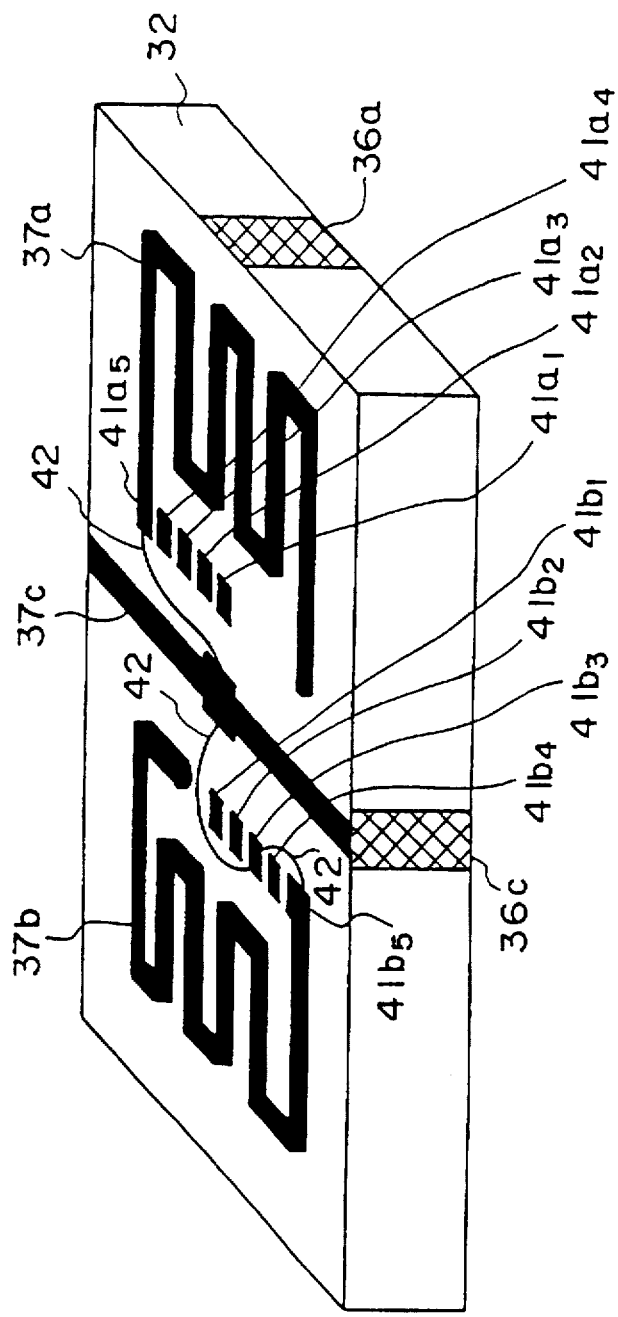
FIG. 7 is a perspective view of a duplexer according to a second embodiment of the present invention.

FIG. 7 is a perspective view of the duplexer 31 according to a second embodiment of the present invention. The duplexer 31 shown in FIG. 7 is constructed such that five discrete adjustment patterns $41a_1$–$41a_5$, for example, are provided at the end of the phase matching circuit pattern 37a on the topmost layer of the multi-layer ceramic package 32 for the purpose of adjusting the length of the line pattern. Further, five discrete adjustment patterns $41b_1$–$41b_5$, for example, are provided at the end of the phase matching circuit pattern 37b on the topmost layer of the multi-layer ceramic package 32.

Once the length of the line pattern is determined, one of the adjustment patterns of the pattern 37a is connected to the common terminal pattern 37c by a wire 42. For example, the adjustment pattern $41a_5$ may be connected to the common terminal pattern 37c. Also, one of the adjustment patterns of the pattern 37b is connected to the common terminal pattern 37c by the wire 42. For example, the adjustment pattern $41b_3$ is connected to the common terminal pattern 37c. In this case, the wire 42 is also used to connect the adjustment patterns $41b_3$ and $41b_5$ with each other.

The adjustment patterns $41a_1$–$41a_5$ and $41b_1$–$41b_5$ are formed when the patterns 37a and 37b are formed.

Figure 8:
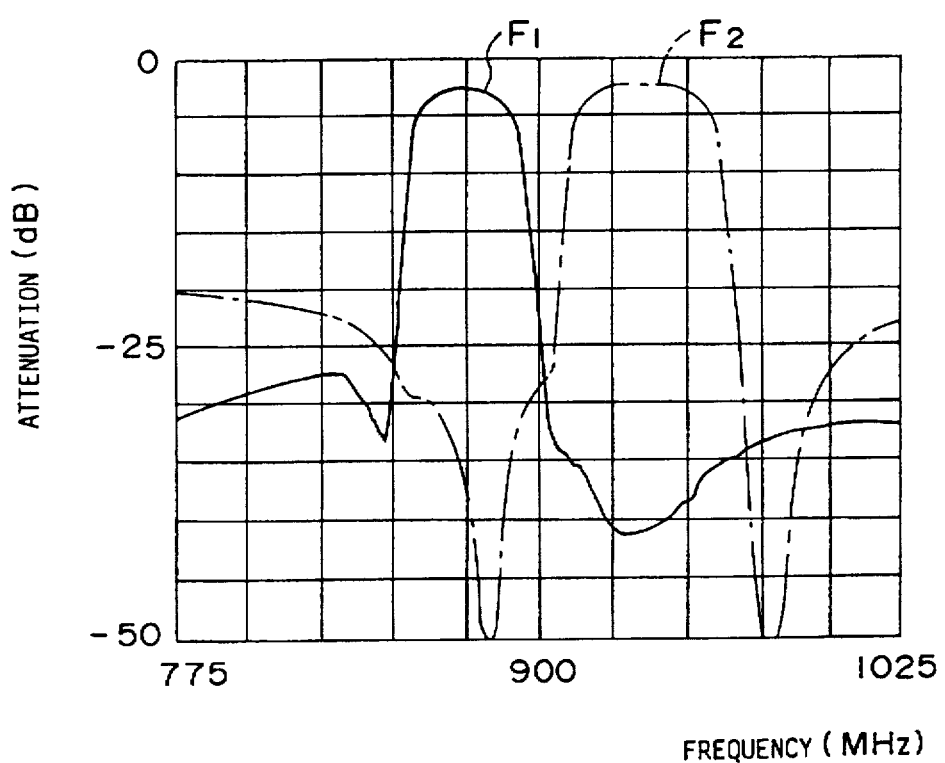
FIG. 8 is a graph showing a frequency characteristic of the duplexer according to the second embodiment.

FIG. 8 is a graph showing a frequency characteristic of the duplexer according to the second embodiment. Referring to FIG. 8, $F_1$ represents a frequency characteristic of the duplexer 31 in which the central frequency of the filter chip 33a ($F_1$) is 875 MHz and the associated selection of one of the adjustment patterns ($41a_1$–$41a_5$) of the phase matching circuit pattern 37a is made and the necessary connection, using the wire 42, is established. $F_2$ represents a frequency characteristic of the filter chip 33b ($F_2$) in which the central frequency is 937 MHz and the associated selection of one of the adjustment patterns ($41b_1$–$41b_5$) of the phase matching circuit 37b is made and the necessary connection, using the wire 42, is established. It will be found that a significant reduction in the attenuation is obtained in the central frequencies. That is, the same effect as that provided by the first embodiment is provided. As described above, the second embodiment enables combinations of filter chips having different sets of central frequencies without modifying the multi-layer ceramic package 32.

While the adjustment patterns $41a_1$–$41a_5$ and $41b_1$–$41b_5$ are formed as discrete patterns in the above-described second embodiment, the adjustment patterns may be a contiguous pattern so that the length of the line pattern may be adjusted by changing a bonding position of the wire 42. However, the unnecessary portions of the adjustment patterns in this arrangement may produce an unfavorable effect on phase matching. The second embodiment resolves this problem by providing the discrete configuration. Therefore, when the length of the adjustment patterns $41a_1$–$41a_5$ and $41b_1$–$41b_5$ is short and the unnecessary portions thereof do not produce an unfavorable effect on the phase matching, it is not necessary to form the discrete patterns.

In an alternative approach, the phase matching circuit patterns 37a and 37b are formed as shown in FIG. 2A, and a predetermined number of adjustment patterns that bypass the meandering configuration of the patterns 37a and 37b are formed. The line length of the patterns 37a and 37b is adjusted such that the bypass portion is trimmed or removed as required.

Figure 9:
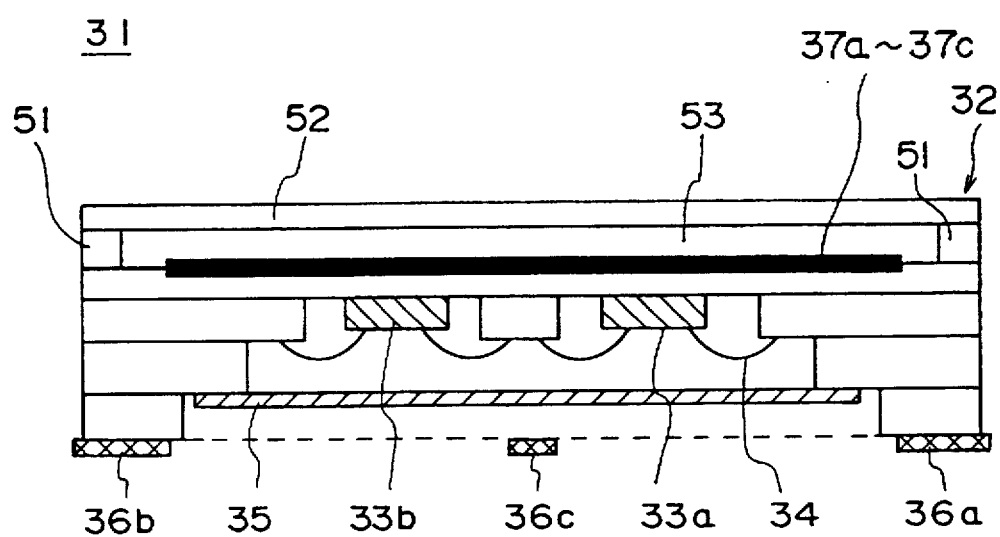
FIG. 9 is a longitudinal sectional view of a duplexer according to the third embodiment of the present invention.

FIG. 9 is a longitudinal sectional view of the duplexer 31 according to the third embodiment of the present invention. In the duplexer 31 shown in FIG. 9, a spacer 51 is disposed on the topmost layer of the multi-layer ceramic package 32 shown in FIGS. 2A and 2B so as to serve as a grounding layer, a shield cap 52 being provided on the spacer 51. The other aspects of the construction are the same as those of the construction shown in FIGS. 2A and 2B (or FIG. 7). The spacer 51 allows the shield cap 52 to be provided above the phase matching circuit patterns 37a and 37b via a gap 53.

According to this arrangement, the shield cap 52 prevents the phase matching circuit patterns 37a and 37b from being affected by the surroundings. When applied to the second embodiment (FIG. 7), the third embodiment ensures that the wire 42 is properly protected.

Figure 10:
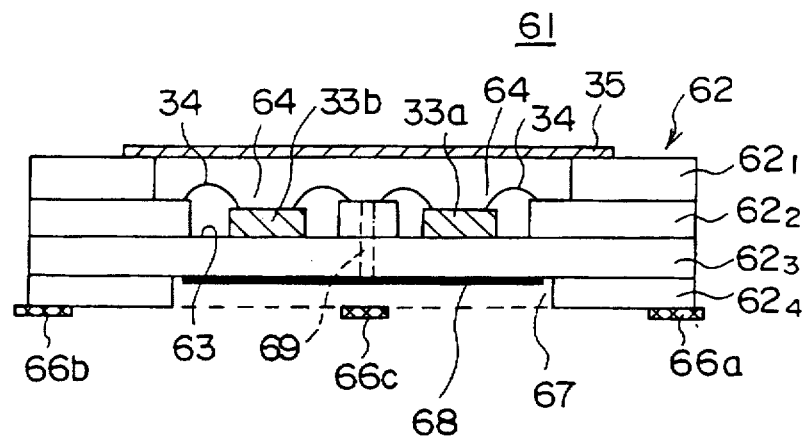
FIG. 10 is a longitudinal sectional view of a duplexer according to a fourth embodiment of the present invention.
Figure 11:
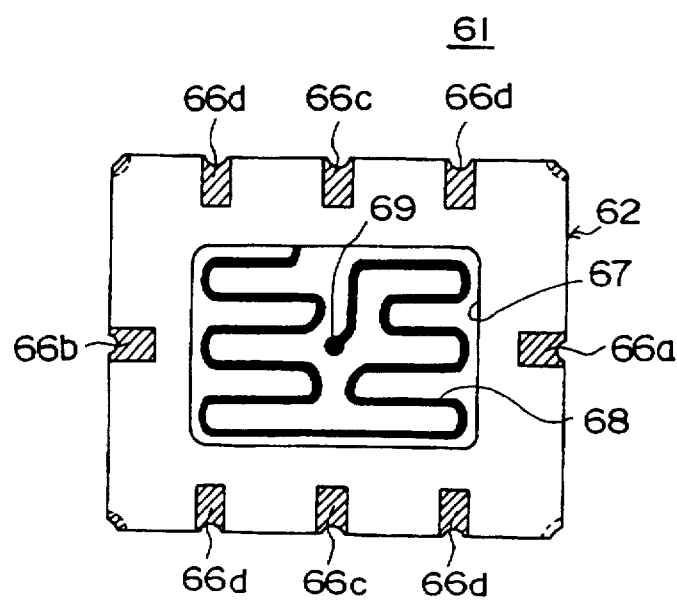
FIG. 11 is a top view of the duplexer according to the fourth embodiment.
Figure 12:
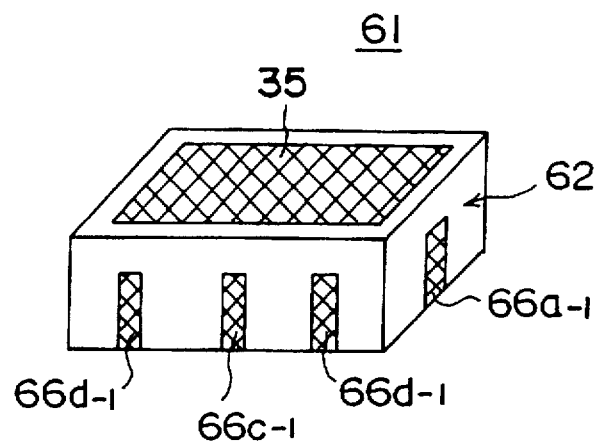
FIG. 12 is a perspective view of the duplexer according to the fourth embodiment.

A description will now be given with reference to FIGS. 10–12, of a fourth embodiment of the present invention. FIG. 10 is a longitudinal sectional view of a duplexer 61 according to the fourth embodiment, FIG. 11 is a bottom view of the duplexer 61 and FIG. 12 is a perspective view of the duplexer 61.

The duplexer 61 comprises a multi-layer ceramic package 62 formed of four layers $62_1$–$62_4$, the filter chips 33a and 33b and the cap 35. As shown in FIG. 11, a reception terminal 66a, a transmission terminal 66b, antenna terminals 66c and grounding terminal 66d are formed on the underside of the bottom layer $62_4$ of the multi-layer ceramic package 62.

The terminals 66a–66d are electrically connected to the filter chips 33a and 33b provided in the multi-layer ceramic package 62 via wirings (hereinafter, referred to as castellations) $66a_{-1}$–$66d_{-1}$ shown in FIG. 12 to be formed on the respective sides of the multi-layer ceramic package 62. The terminals 66a–66d formed on the underside of the bottom layer $62_4$ correspond to terminals described in claim 8. When the duplexer 61 is mounted on another circuit board, the terminals 66a–66d are coupled to the circuit board.

An opening is formed in the top layer $62_1$ and the second layer $62_2$ to provide a first cavity 64 for accommodating the surface-acoustic-wave band pass filter chips 33a and 33b. The filter chips 33a and 33b are mounted on a chip mounting surface 63 formed on the third layer $62_3$. Accordingly, the filter chips 33a and 33b are located in the first cavity 64 formed by the layers $62_1$ and $62_2$ in cooperation with each other.

Predetermined signal patterns and grounding patterns are formed on the second layer $62_2$, each of the patterns being connected to the respective castellations $66a_{-1}$–$66d_{-1}$. The signal patterns and the grounding patterns formed on the second layer $62_2$ are also connected to the filter chips 33a and 33b via the wires 34. In this way, electrical connection between the filter chips 33a and 33b, and the terminals 66a–66d is ensured.

The cap 35 is formed on the top layer $62_1$ so as to cover the first cavity 64 formed in the multi-layer ceramic package 62. In this way, it is ensured that the multi-layer ceramic package 62 containing the filter chips 33a and 33b is hermetically sealed.

The bottom layer $62_4$ is also provided with an opening so that the third layer $62_3$ and the bottom layer $62_4$ in cooperation with each other form a second cavity 67 at the bottom of the multi-layer ceramic package 62. On the underside of the third layer $62_3$ exposed in the second cavity 67 are formed a meandering phase matching circuit pattern 68. The phase matching circuit pattern 68 is formed as microstrip lines. The microlines are formed of a copper or a conductive material whose main component is a copper. One end of the phase matching circuit pattern 68 is connected to the filter chips 33a and 33b via a through hole 69, and its other end is connected to the antenna terminal 66c via a wiring (not shown) formed on the third layer $62_3$.

It is to be noted that the phase matching circuit pattern 68 in the duplexer 61 according to the fourth embodiment is formed in the second cavity 67 formed on the bottom of the multi-layer ceramic package 68. Accordingly, when the duplexer 61 is mounted on another circuit board, the phase matching circuit pattern 68 is made to face the board on which the duplexer 61 is mounted so that radiation to the outside is restricted.

Figure 13:
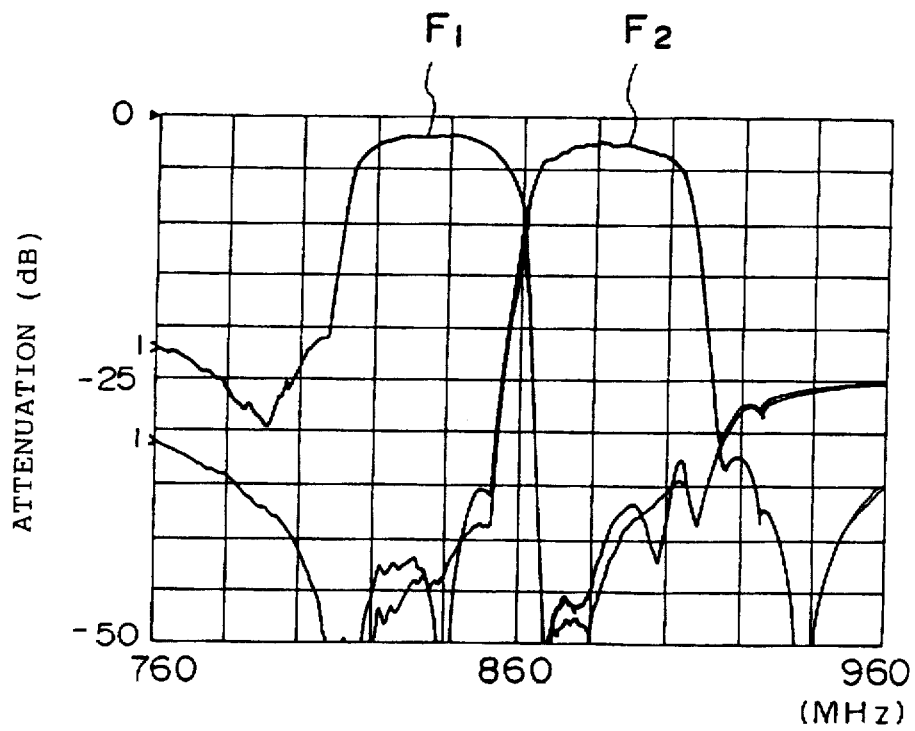
FIG. 13 is a graph showing a frequency characteristic of the duplexer according to the fourth embodiment of the present invention.

FIG. 13 is a graph showing an attenuation versus frequency characteristic of the duplexer according to the fourth embodiment. The frequency characteristic shown in FIG. 13 is obtained through measurement conducted under the same condition as the measurement of FIGS. 6A and 6B. Specifically, the frequency characteristic shown in FIG. 13 is obtained experimentally by forming the phase matching circuit pattern 68 to have a width of about 200 μm and a length of about 25 mm. The dielectric constant of the third layer $62_3$ of the multiple-layer ceramic package 32 constituting the duplexer 31 is 9.7. FIG. 13 illustrates a loss due to the phase matching circuit pattern 68 and a variation in a loss provided by one of the filter chips in a pass band for the other of the filter chips. In other words, FIG. 13 illustrates a duplexing performance of the duplexer 61.

Comparing FIG. 13 with FIGS. 6A and 6B, the duplexer 61 according to the fourth embodiment and the duplexer 31 according to the first embodiment exhibit largely similar characteristics. The duplexer 61 provides an excellent filter characteristic.

As described above, by using a low-resistance material such as a copper to form the phase matching circuit pattern 68 in the duplexer 61, degradation in the filter characteristic due to a loss provided by the resistance of the pattern 68 can be reduced to about half. It will be further appreciated that degradation in the reflection coefficient due to the floating capacity can be remedied so that degradation in the filter characteristic of the duplexer 61 can be prevented.

Since the antenna terminals 66c are formed to extend from both sides of the bottom of the multi-layer ceramic package 62, there is an increased flexibility in terms of the orientation of the terminals. Since the phase matching circuit pattern 68 of the duplexer 61 is made to face the board on which the duplexer 61 is mounted, radiation to the outside is restricted.

Like the phase matching circuit patterns of FIG. 7, the phase matching circuit pattern 68 may be divided into discrete patterns. Alternatively, the line length may be varied not by dividing the phase matching circuit pattern 68 but by varying wire bonding positions.

In an alternative approach, the phase matching circuit pattern 68 is formed as shown in FIG. 2A, and a predetermined number of adjustment patterns that bypass the meandering configuration of the patterns (which correspond to the patterns 37a and 37b) are formed. The line length of the pattern 68 is adjusted such that the bypass portion is trimmed or removed as required.

Figure 14:
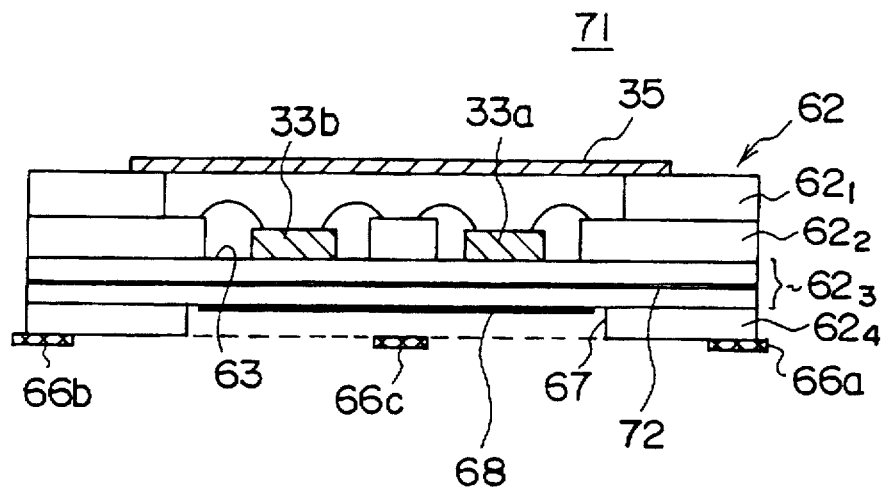
FIG. 14 is a longitudinal sectional view of a duplexer according to a fifth embodiment of the present invention.
Figure 15:
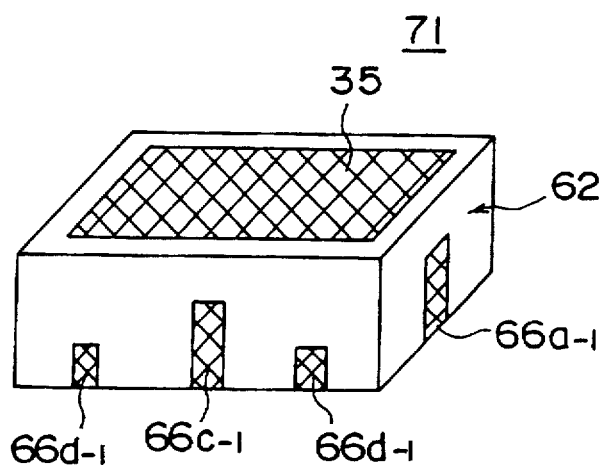
FIG. 15 is a perspective view of the duplexer according to the fifth embodiment.

A description will now be given, with reference to FIGS. 14 and 15, of a fifth embodiment of the present invention. FIG. 14 is a longitudinal sectional view of a duplexer 71 according to the fifth embodiment, and FIG. 15 is a perspective view of the duplexer 71. In FIGS. 14 and 15, those components that correspond to the components of the duplexer 61 according to the fourth embodiment described with reference to FIGS. 10–12 are designated by the same reference numerals and the description thereof is omitted.

The duplexer 71 according to the fifth embodiment differs from the duplexer 61 according to the fourth embodiment in that a common grounding pattern 72 is formed between the chip mounting surface 63 and the terminals 66a–66d.

More specifically, the third layer $62_3$ is divided into two sub-layers and a conductive film is formed between the sub-layers so that the common grounding pattern 72 is formed between the chip mounting surface 63 and the terminals 66a–66d.

The common grounding pattern 72 is connected to the castellations $66d_{-1}$ shown in FIG. 15. Thus, the common grounding pattern 72 is connected, via the castellations $66d_{-1}$ to the grounding terminals 66d (FIG. 11) formed on the bottom.

Because the common grounding pattern 72 is connected to the grounding terminals 66d in the duplexer 71 having the above-described arrangement, the castellations $66d_{-1}$ formed on the side of the multi-layer ceramic package 62 may be relatively short (see FIG. 15). By reducing the length of the castellations $66d_{-1}$, it is possible to reduce an inductance of the castellations $66d_{-1}$.

Figure 16:
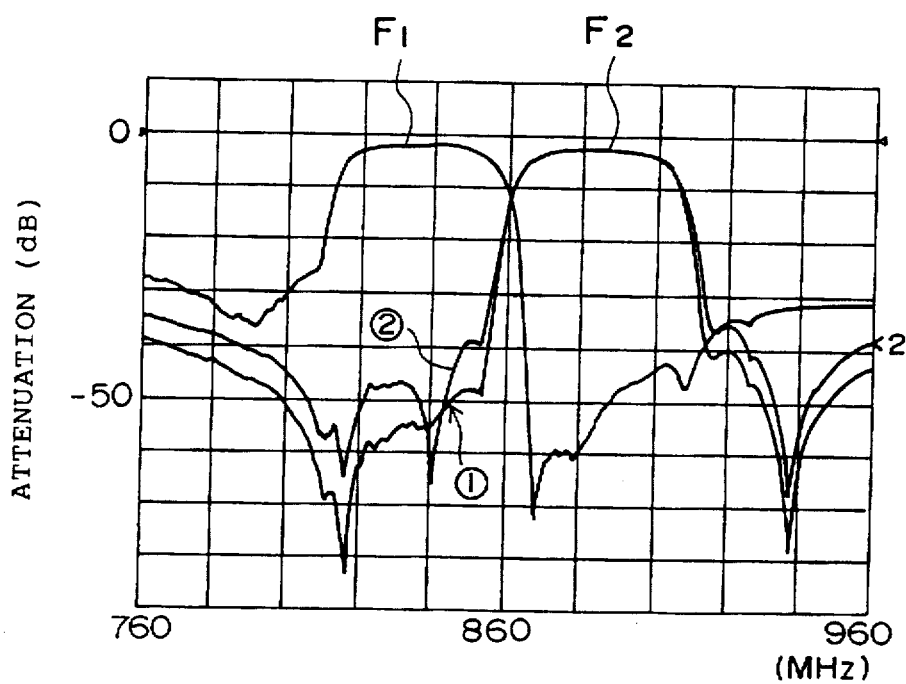
FIG. 16 is a graph showing a frequency characteristic of the duplexer according to the fifth embodiment.

FIG. 16 is a graph showing the characteristic (indicated by ①) of the duplexer 71 according to the fifth embodiment as compared to the characteristic (indicated by ②) of a conventional duplexer. As shown in FIG. 16, the attenuation characteristic of the duplexer 71 according to the fifth embodiment is better than that of the conventional duplexer especially outside the pass band. Thus, the fifth embodiment improves the attenuation characteristic outside the pass band.

Figure 17:
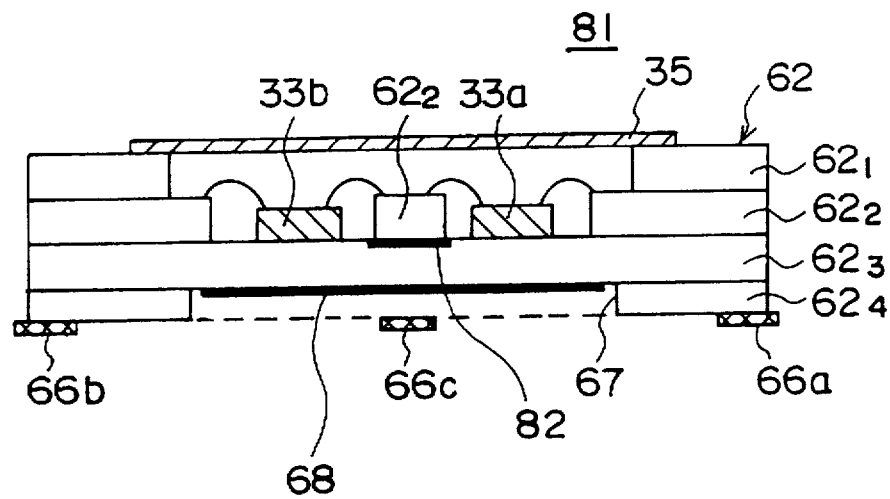
FIG. 17 is a longitudinal sectional view of a duplexer according to a sixth embodiment.
Figure 18:
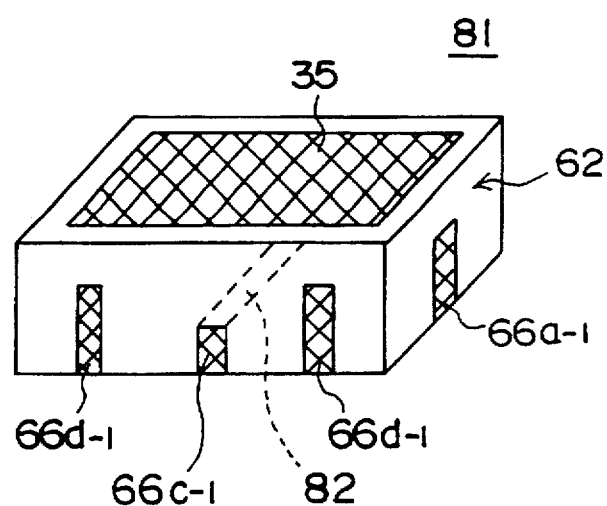
FIG. 18 is a perspective view of the duplexer according to the sixth embodiment.

A description will now be given, with reference to FIG. 17 and 18, of a sixth embodiment of the present invention. FIG. 17 is a longitudinal sectional view of a duplexer 81 according to the sixth embodiment, and FIG. 18 is a perspective view of the duplexer 81 according to the sixth embodiment. In FIGS. 17 and 18, those components that correspond to the components of the duplexer 67 according to the fourth embodiment described with reference to FIGS. 10–12 are designated by the same reference numerals and the description thereof will be omitted.

The duplexer 81 according to the sixth embodiment differs from the duplexer 61 according to the fourth embodiment in that an antenna terminal pattern 82 connected to the filter chips 33a and 33b is formed inside the multi-layer package 62.

More specifically, the antenna pattern terminal 82 is formed between the underside of the second layer $62_2$ and the topside of the third layer $62_3$ constituting the multi-layer ceramic package 62 of the duplexer 81. The ends of the antenna terminal pattern 82 are connected to a pair of castellations $66c_{-1}$ formed on the respective sides of the multi-layer ceramic package 62, as shown in FIG. 18.

With the above-described arrangement of the duplexer 81, leakage of signals from the antenna terminal pattern 82 is less than that of the other arrangements. In a construction like that of the duplexer 31 described with reference to FIGS. 2A and 2B, wherein the common terminal pattern 37c that functions as an antenna terminal pattern is exposed on top of the multi-layer package 32, signals may leak from the common terminal pattern 37c. However, according to the sixth embodiment in which the antenna terminal pattern 82 is formed inside the multi-layer ceramic package 62, the multi-layer ceramic package 62 performs a shielding function. Therefore, the antenna terminal pattern 82 produces a smaller leakage than the antenna terminal patterns that are formed otherwise.

The present invention is not limited to the above described embodiments, and variations and modifications may be made without departing from the scope of the present invention.

What is claimed is:

1. A duplexer comprising:

an integrally formed multi-layer package, said multi-layer package formed of an alumina-ceramic;

a predetermined number of surface-acoustic-wave band pass filter chips having different pass-band central frequencies mounted on an interior side of the multi-layer package a cap, mounted on said multi-layer package, said cap and said multi-layer package hermetically sealing said surface-acoustic-wave band pass filter chips; and phase matching circuit patterns connecting the surface-acoustic-wave band pass filter chips formed on an exterior surface layer of the multi-layer package.

2. The duplexer as claimed in claim 1, wherein the phase matching circuit patterns are formed as microstrip lines.

3. The duplexer as claimed in claim 1, wherein the phase matching circuit patterns are formed as layers containing a copper member.

4. The duplexer as claimed in claim 1, wherein a grounding layer is provided above the phase matching circuit patterns via an insulating layer.

5. The duplexer as claimed in claim 1, wherein a predetermined number of external connection terminals are formed in a bottom layer of the multi-layer package, and each of the phase matching circuit patterns is connected to one of the external connection terminals via a common terminal.

6. The duplexer as claimed in claim 1, wherein the phase matching circuit patterns include a predetermined number of adjustment patterns for adjustment of the length of the phase matching circuit patterns between an input and an output of the phase matching circuit.

7. A duplexer comprising:

a predetermined number of surface-acoustic-wave band pass filter chips having different pass-band central frequencies; and a multi-layer package having said predetermined number of filter chips mounted on a chip mounting surface and having terminals for connection with external circuits formed in a bottom layer of the multi-layer package; and phase matching circuit patterns connected between the surface-acoustic-wave band pass filter chips, said phase matching circuit patterns being formed on an exterior surface of said multi-layer package, wherein said exterior surface of said multi-layer package is disposed between said chip mounting surface and said terminals.

8. The duplexer as claimed in claim 7, wherein said phase matching patterns are formed as microstrip lines.

9. The duplexer as claimed in claim 8, wherein said phase matching patterns are formed as layers containing a copper member.

10. The duplexer as claimed in claim 7, wherein common grounding patterns are formed between said chip mounting surface and said terminals.

11. The duplexer as claimed in claim 7, wherein an antenna terminal pattern connected to said filter chips is formed inside said multi-layer package.

* * * * *